United States Patent [19]
Heigl et al.

[11] Patent Number: 5,122,878
[45] Date of Patent: Jun. 16, 1992

[54] TELEVISION TUNER AND CIRCUITRY FOR SWITCHING BETWEEN TWO FREQUENCY RANGES

[75] Inventors: Franz Heigl, Ochsenfeld; Ludwig Küspert, Hofstetten, both of Fed. Rep. of Germany

[73] Assignee: Telefunken electronic GmbH, Heilbronn, Fed. Rep. of Germany

[21] Appl. No.: 368,540

[22] Filed: Jun. 20, 1989

[30] Foreign Application Priority Data

Jun. 28, 1988 [DE] Fed. Rep. of Germany ....... 3821716

[51] Int. Cl.⁵ .................. H04N 5/62; H04B 1/06; H04B 1/16
[52] U.S. Cl. ................... 358/191.1; 455/188.1; 455/191.1; 455/180.1
[58] Field of Search ............ 358/191.1, 193.1, 195.1; 455/188, 189, 191, 168, 180, 195, 209, 286, 339, 340

[56] References Cited

U.S. PATENT DOCUMENTS

| | | | |
|---|---|---|---|
| 3,962,643 | 6/1976 | Ma | 455/180 |
| 3,980,957 | 9/1976 | Puitzer | 455/180 |
| 4,132,952 | 1/1979 | Hongu | 455/188 |
| 4,419,768 | 12/1983 | Yamashita et al. | 455/180 |
| 4,470,071 | 9/1984 | Rindal | 358/198 |
| 4,736,457 | 4/1988 | Kupfer | 455/188 |
| 4,756,024 | 6/1988 | Kupfer | 455/188 |

FOREIGN PATENT DOCUMENTS

| | | |
|---|---|---|
| 2929901C2 | 1/1983 | Fed. Rep. of Germany . |
| 3144390A1 | 5/1983 | Fed. Rep. of Germany . |
| 3538921A1 | 5/1987 | Fed. Rep. of Germany . |
| 2196197 | 4/1988 | United Kingdom . |
| 2196198 | 4/1988 | United Kingdom . |

OTHER PUBLICATIONS

Schematic diagram dated Jul. 26, 1984 for Tuner 260-82370 of the Firm Loewe Opta GmbH Industriestrasse 11, 8640 Kronach, Germany.
Data Sheet dated Apr. 1985 for VHF/UHF Television Tuner UV 617, UV 618,256 of the Firm Valvo, Hamburg, Germany.
Philips Development Data Sheet dated Jun. 1985 for VHF/UHV Television Tuners, UV 615, UV 616/256.

Primary Examiner—Tommy P. Chin
Attorney, Agent, or Firm—Spencer & Frank

[57] ABSTRACT

An input circuit and a television tuner for at least two frequency bands. The television tuner has a joint pre-amplifier whose output is connected to two independent, switchable and tunable band-pass filter circuits for the two frequency bands, preferably extending from VHF band I up to and including the hyperband. To achieve a high selection effect with a simple circuit structure and low space requirement, a two-stage switching device is connected to the output of the pre-amplifier, to which device separate inputs of the independent band filters are connected. The input circuit has a pre-circuit filter comprising a frequency-determining capacitor, and a series circuit connected parallel thereto including three frequency-determining coils. The first coil, like the capacitor, is connected at one end to ground and the third coil, like the capacitor, has its output end connected to the pre-amplifier input. A single range switch is connected parallel to two of the coils while a further coil array is connected between an antenna connection and a pickup of the series circuit. To achieve a good pre-selection and power match with minimal circuitry between the antenna connection and the input of the pre-amplifier, the coil array in the pre-circuit filter is a matching coil between the antenna connection and the connection point of the second and third coils.

34 Claims, 1 Drawing Sheet

TELEVISION TUNER AND CIRCUITRY FOR SWITCHING BETWEEN TWO FREQUENCY RANGES

BACKGROUND OF THE INVENTION

The invention relates to a television tuner for at least two frequency bands having a joint pre-amplifier and having a switchable and tunable band-pass filter circuit connected to the output of the pre-amplifier for the two frequency bands, preferably for the frequency range from VHF band I up to and including the hyper band. The invention further relates to an input circuit of a television tuner and a television turner having a joint antenna connection for two frequency ranges sweeping the frequencies from VHF band I up to and including the hyper band, a pre-circuit filter, a preamplifier circuit dimensioned for the two frequency ranges, and two independent band-pass filters dimensioned for a low and a high frequency range respectively and a subsequent mixer stage and intermediate frequency circuit.

In a known television tuner (DE-PS 29 29 901) a switchable pre-circuit filter is provided at a joint antenna connection and the output of the former is connected to a joint pre-amplifier. Behind the output of the pre-amplifier is connected a switchable band-pass filter circuit, also rated for two frequency ranges and whose resonant circuits each have two series-connected coils of which one can be short-circuited by DC-controlled band-switching diodes. The joint output of the band-pass filter circuit is connected to a mixer circuit. Accordingly, two switching elements are required for switchover of a combined band-pass filter circuit, and corresponding DC supply paths must be provided for these elements. These switching diodes represent capacitive and ohmic loads that not only adversely affect selection, but also restrict the frequency tuning range, so that tuning within a frequency range covering the VHF band I up to and including the hyper band cannot be swept.

SUMMARY OF THE INVENTION

One object of the invention is to provide a television tuner of the type described at the outset, by which a high selection effect over a continuous and wide frequency range can be achieved with a simple construction.

This object is attained in accordance with the invention by connecting a two-stage switching device to the output of the pre-amplifier, this device being connected to the separate inputs of independent band-pass filters.

In a tuner design in accordance with the invention, the two-stage switching device and the two separate band-pass filters permit the construction elements necessary for switching not to be part of the actual resonant circuit of the respective band-pass filter circuit, so that the tuning range and the resonant circuit quality, and therefore the selection factor, are not adversely affected. In addition, each band-pass filter can be optimally dimensioned for the frequency band in accordance with the intended purpose, so that no compromises are necessary when dimensioning. In particular, it is thereby possible to selectively tune the entire frequency range from the VHF band I up to and including the hyperband with only two tunable band-pass filters, with one frequency band ranging from 50 MHz to 150 MHz and the other from 150 MHz to 470 MHz, for example. Preferably, the band-pass filter for the high frequency range is connected to the output of the pre-amplifier via a capacitor on the one side, and the band-pass filter for the low frequency range via the series circuit comprising a coil and a capacitor on the other side, with a single band-switching diode being connected between the connection point of the high-pass coil to the low-pass capacitor and the earth potential. With the band switch open, the band-pass filter is then detuned to such an extent for the high frequency range that selection to the reception frequency practically no longer occurs, while the band-pass filter for the low frequency range is coupled optimally to the pre-stage via the low-pass filter. With the band switch closed, on the other hand, the input of the band-pass filter for the low frequency range is short-circuited as regards high frequency, with coil 40 and capacitor 39 forming a high-pass filter dimensioned for the high frequency range, using which the band-pass filter for the high frequency range is so adjusted to the pre-amplifier that it achieves its optimum selection effect.

Another object of the invention is to provide a tuner of the type described at the outset that requires little space and a minimum of components with the use of modern integrated tuner circuit means, and that affords very good reception with high interference immunity.

This object attained by a resonant circuit with switchable coils forming a combined pre-circuit filter for both frequency ranges, with the output of said filter being connected to an input of a preamplifier, by the output of the preamplifier being connected to a two-stage switching device switching over simultaneously with the pre-circuit filter and to which the band-pass filters are connected separately, and by the outputs of the band-pass filters each being connected to their own mixer stages.

In a tuner construction in accordance with the invention, only a joint frequency-determining capacitor and one switching diode in addition are required for the pre-circuit filter, with the joint output of this pre-circuit filter circuit only requiring one preamplifier for both frequency ranges. This reduces the number of components and thus the space requirement to a minumum. High-frequency switching from the joint pre-stage to the two separated band-pass filters is therefore feasible at low expense, while the also separated mixer stages permit the setting of optimum mixing conditions for the two frequency ranges. However, the desired high interference immunity is achieved with very good reception properties.

A still further object of the invention is to provide an input circuit that requires a minimum of components and tuning work, and at the same time effects power matching of the high-resistance input of the pre-stage connected behind the low-resistance antenna connection.

This object is attained by the coil array in the pre-circuit filter being a matching coil between the antenna connection and the connection point of the second and third coil of the series circuit, the sole range switch being connected in parallel with the second and third coil of the series circuit, and the first coil being frequency-determining for the high frequency range.

The pre-circuit filter here preferably comprises the series circuit of three frequency-determining coils to which a joint frequency-determining capacitor is connected in parallel. The first coil here is connected to earth potential and the third coil to the input of the preamplifier, with only one range switch being parallel to the series circuit comprising the second and third coils. In addition, a matching coil is connected to the connection point between the second and third coils that is connected on the other side to the antenna connection. The first coil is here frequency-determining for the high frequency range, while the three coils in series together define the low frequency range. The joint resonant circuit capacitor is here preferably alterable so that a selection of certain channels is feasible within the frequency ranges. The preamplifier is preferably connected to the band-pass filters in such a way that the band-pass filter for the high frequency range is connected via a capacitor, and the band-pass filter for the low frequency range via the series circuit comprising a coil and low-pass capacitor, with a single band switch being provided between the connection point of the coil to the capacitor and the earth potential. With the band switch opened, the band-pass filter for the high frequency range is detuned so far that selection practically no longer occurs, while the band-pass filter for the low frequency range is optically coupled to the pre-stage via the low-pass filter. With the band switch closed, on the other hand, the input of the band-pass filter for the low frequency range is short-circuited at high frequency, with the coil and the capacitor forming a high-pass filter dimensioned for the high frequency range, using which the band-pass filter for the high frequency range is so matched to the preamplifier than an optimum selection effect is achieved.

In an input circuit in accordance with the invention, only three frequency-determining coils are needed, which are so dimensioned that, in conjunction with the sole range switch, the entire frequency band to be swept is divided into two frequency ranges. In particular, the capacitive load from these coils is very low, so that a large frequency tuning range is obtained that only requires a division into two frequency-bands. In the low frequency range all three frequency-determining coils are effective, while in the high frequency range only the first coil is frequency-determining, whereas the other two coils form a parallel circuit connected in series to the antenna connection and serve to match the power. The power match in the low frequency range is achieved with the matching coil connected in series to the antenna connection and with the matching coil's connection to the connection point between the second and third coil of the series circuit. Turning work to match the inductance values can be carried out for the low frequency range at the second or third coil and for the high frequency range at the first coil. Here, a change in the inductance of the first coil in the low frequency range has practically no effect, since its inductance is low in comparison with the overall inductance of the series circuit. A change in the matching coil has no effect on the set frequency range. The matching coil for the power match is determined in the high frequency range. The input circuit is preferably part of an overall tuner circuit, with the output of the pre-circuit filter being connected to an input of a joint pre-amplifier whose output is connected to a two-stage changeover device switched simultaneously with the pre-circuit filter and to which are connected independent band-pass filters whose outputs are each connected to their own mixer stage with separate intermediate frequency selection.

BRIEF DESCRIPTION OF THE DRAWINGS

The invention will now be described in greater detail, with reference to circuit diagrams of an embodiment.

DESCRIPTION OF THE PREFERRED EMBODIMENTS

Figure 1:
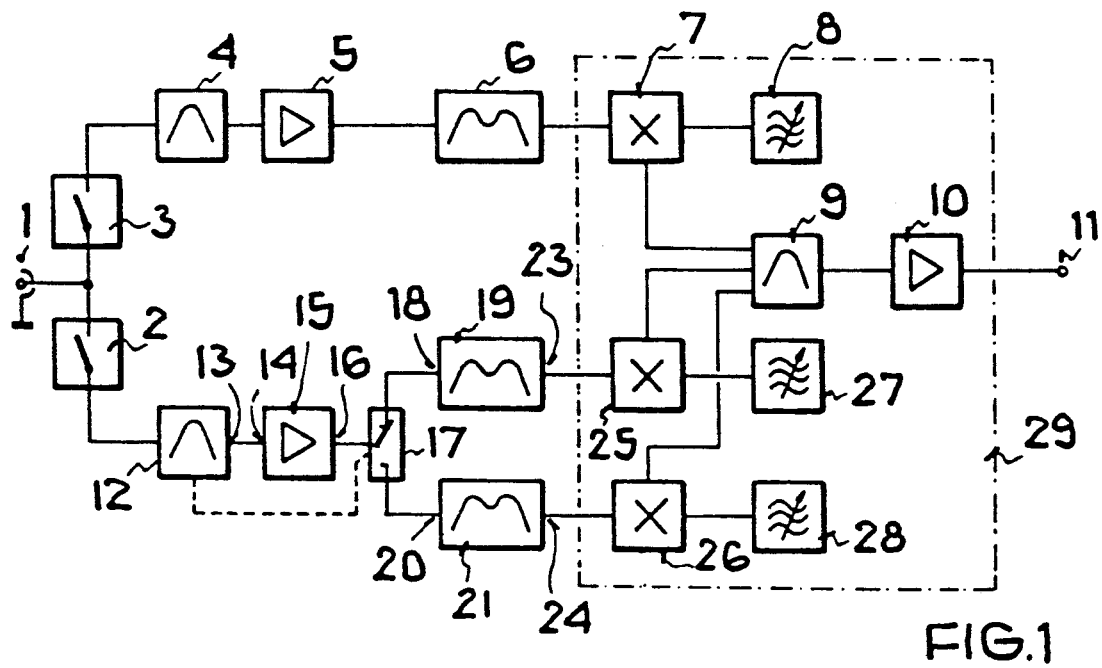
FIG. 1 shows a block diagram of a tuner constructed in accordance with the invention.

A television tuner in accordance with FIG. 1 is provided with a joint antenna connection 1, from which a first range switch 2 leads to a tuner branch for the frequencies of the VHF band I up to and including the hyperband, and a second range switch 3 to a UHF tuner branch. The UHF tuner branch comprises a pre-circuit filter 4 having a subsequent pre-amplifier 5, and band-pass filter 6 adjacent thereto having a subsequent mixer stage 7 to which is allocated an independent oscillator 8.

The UHF mixer stage 7 is coupled to an intermediate frequency circuit 9 which is followed by an intermediate frequency amplifier 10 having an intermediate frequency output 11.

By contrast, a pre-circuit filter 12 is connected to the first range switch 2 and can be switched over to a low and directly adjacent higher frequency range. This pre-circuit filter 12 combined for the two frequency ranges is connected by its joint filter output 13 to the input 14 of a joint pre-amplifier 15. Output 16 of pre-amplifier 15 is connected to a two-stage switching device 17, to one of whose outputs is connected input 18 of a band-pass filter 19 dimensioned for the low frequency range, and to whose other output is connected input 20 of a band-pass filter 21 dimensioned for the high frequency range. Switch-over of the pre-circuit filter and of the switching device 17 is effected simultaneously via a switch connection 22 indicated by a dashed line, depending on the selected frequency range. Outputs 23 and 24 of band-pass filters 19 and 31 respectively are each connected to an independent mixer stage 25 or 26. Mixer stages 25 and 26 are each provided with their own oscillator 27 or 28 respectively. In addition, the mixer stages 25 and 26 are connected independently of one another to the joint intermediate frequency circuit 9. The mixer stages and oscillators are part of an integrated tuner circuit 29, for example of type TDA 5330 T or TUA 2007. The separated band-pass filters 19 and 21 afford very high reception sensitivity with high interference immunity, since they can be optimally dimensioned for the appropriate frequency range and require no switching diodes that can affect the tuning range. For this reason there are no special switching voltages necessary for switching diodes. The independent mixer stage provided in each case also contributes to high selection and interference immunity, so that the usual compromises in mixer stage wiring can be dispensed with.

Figure 2:
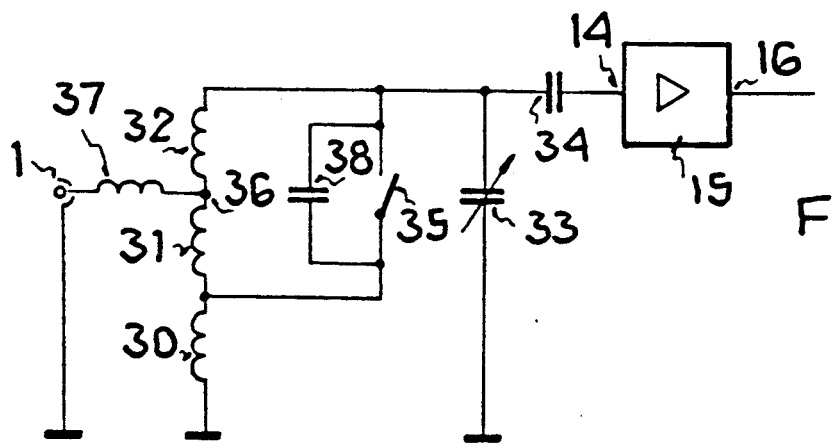
FIG. 2 is a schematic diagram of a pre-circuit filter, according to the invention showing the connection of the components the low frequency range.

The pre-circuit and pre-amplifier circuit is shown in FIG. 2 without allowance for the first range switch 2. The pre-circuit filter accordingly comprises a series circuit of three frequency-determining coils 30, 31 and 32, to which a joint frequency-determining capacitor 33 preferably in the form of a controllable-voltage capacitance diode is connected in parallel. The first coil 30 is connected to ground on the one side, and the third coil 32 via a separating capacitor 34 to input 14 of pre-amplifier 15. Parallel to the series circuit, comprising the second and third coils 31 and 32, is a range switch 35 designed in particular as a DC-controllable switching diode. A matching coil 37 leads to the antenna connection 1 from the connecting point 36 between the second and the third coils 31 and 32. In the switching position shown in FIG. 2, the pre-circuit filter 12 is dimensioned for the low frequency range which extends from approx. 50 MHz to 150 MHz. Within this frequency range the matching coil 37 is largely ineffective at low frequencies in particular. Basic matching is achieved here by the division ratio of the inductance values of coils 30, 31, and 32. The capacitance variation of capacitor 33 thus permits tuning of the low frequency range in which all three coils 30, 31, and 32 are frequency-determining. Since the frequency variation range in the low frequency range is somewhat lower than in the high frequency range, which extends from about 150 MHz to 470 MHz, a correction capacitor 38 can be connected parallel to the range switch 35, this capacitor limiting to the necessary extent the effective variation range of capacitor 33 when range switch (35) is open. Range switch (35) therefore serves at the same time to alter the tuning ratio.

If range switch 35 is closed, than only coil 30 is connected directly parallel to capacitor 33 and so determines the high frequency range. With range switch 35 closed, the correction capacitor 38 too is short-circuited and so capacitor 33 alone determined the frequency with its entire variation range. In addition, when range switch 35 is closed the series circuit comprising coils 31 and 32 also becomes a parallel circuit which is connected in series to matching coil 37. Coils 31, 32, and 37 then act jointly to match the pre-circuit filter circuit to the wave impedance of the antenna line, the inductance of matching coil 37 then being changeable in order to tune the match. This change has practically no effect in the lower frequency range. Also, any change in the inductance of coil 30 to be made to tune the resonant circuit affects the resonaqnce frequency of the entire resonat cricuit only negligibly in the lower frequency range, since the inductance of coil 30 is low compared to the total inductance of coils 31 and 32. This pre-circuit connection also requires only a joint pre-amplifier 15, so that just one range switch 35 permits a frequency range switchover, a change in the tuning ratio and a changeover of the adjustment in the frequency ranges. For this minimum number of components, therefore, only a small space is required in the tuner housing, without adverse effects on selection, tuning range or interference immunity.

Figure 3:
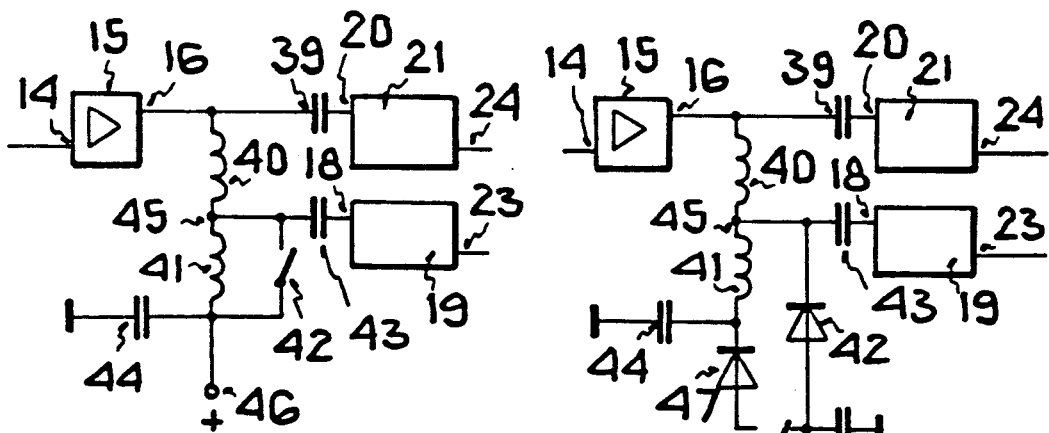
FIG. 3 shows a schematic switching circuit array for connection of band-pass filters to the pre-stage.

At output 16 of pre-amplifier 15 is connected the switching device 17 for band-pass filters 19 and 21, with the switching device in accordance with FIG. 3 having a capacitor 39 connected from output 16 to input 20 of band-pass filter 21 for the high frequency range. A coil 40 passes from output 16 via the parallel connection of a high-frequency choke 41 and a band switch 42 to a current source 46, or via a low-pass capacitor 43 to input 18 of band-pass filter 19 for the low frequency range. Band switch 42 is, like the high-frequency choke 41, connected to ground via a blocking capacitor 44 for high frequency. Band switch 42, is preferably a switching diode and is controlled together with range switch 35. With band switch 42 closed, capcitor 39 forms with coil 40 a high-pass filter for the high frequency range, with connection point 45 of coil 40 and capacitor 43 being connected via band switch 42 to ground.

The band-pass filter for the low frequency range is therefore high-frequency, input-side and short-circuited. The high-pass filter 39, 40 therefore permits an optimum adjustment between pre-amplifier 15 and band-pass filter 21.

With non-conduction, i.e. open band switch 42, by contrast, coil 40 with capacitors 43 and 39 forms a low-pass filter for the low frequency range, with capacitor 39 is ground via the input impedance of band-pass filter 21, with the connected band-pass filter 19 detuning band-pass filter 21 for the high frequency range coupled via capacitor 39 to such an extent that selection of certain frequencies is no longer possible.

With high-frequency choke 41, there is a DC path to output 16 of amplifier 15 when band switch 42 is opened, so that via this path the amplifier element present in preamplifier 15 can be supplied with DC current without affecting the low-pass filter.

Figure 4:
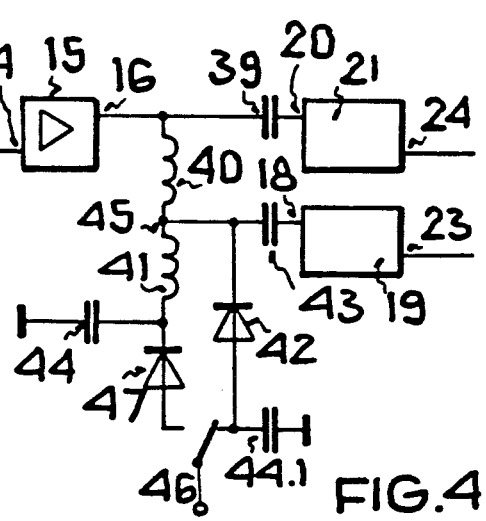
FIG. 4 shows the circuit array according to FIG. 3 supplemented with DC paths.

In FIG. 4 a circuit array in accordance with FIG. 3 is shown, in which a switching diode 42 is used as the band switch. Here, a simple diode 47 is provided in series with the high-frequency choke 41 with otherwise identical circuit structure, via which diode the DC current is supplied to pre-amplifier 15 when the low frequency range is to be activated. In this case, switching diode 42 is without current and therefore blocked, and the range switch therefore open. If, on the other hand, switching diode 42 is connected to DC source 46, the current flowing through it effects through-switching, thereby closing the band swuitch. The circuit array is then switched to the high frequency range once connection point 45 is connected to ground via switching diode 42 and the allocated blocking capacitor 44.1. In switching device 17, switching diode or band switch 42 is neither in a frequency-determining resonant circuit nor in the high frequency path from pre-amplifier 15 to band-pass filters 19, 21, so that it does not exercise adverse effects on selection and the tunable band width.

What is claimed is:

1. A television tuner for at least two frequency bands VHF band I up to and including the hyperband, one of the bands being in a high frequency range and another being in a low frequency range, said television tuner comprising:
   a joint pre-amplifier;
   a two-stage switching device connected to the output of said pre-amplifier and having two outputs; and
   a band-pass filter circuit comprising a first band-pass flter connected to one of the two switching outputs and a second band-pass filter connected to the other switching output, said band-pass filter circuit being switchable and tunable between said at least two frequency bands; and
   a pre-circuit filter for dividing the at least two frequency bands into two reception frequency ranges, one range being in the high frequency range, the other range being in the low frequency range, said filter comprising a single range switch and an output, the output of which is connected to the pre-amplifier, wherein the switching device is switched together with the single range switch of the pre-circuit filter which is switchable to one of the ranges of the at least two frequency bands.

2. A television tuner according to claim 1, wherein said pre-circuit filter is tunable.

3. A television tuner according to claim 1 wherein said pre-circuit filter further comprises a correction capacitor connected in parallel with said range switch.

4. A television tuner according to claim 1, wherein the outputs of said first and second band filters are each connected to their respective mixer stages.

5. A television tuner according to claim 1, further comprising an antenna connection, and a coupling capacitor having a first terminal connected to the output of the pre-circuit filter and a second terminal connected to the input of said pre-amplifier wherein said pre-circuit filter further comprises:
- a frequency-determining capacitor, said frequency-determining capacitor being grounded at one end being coupled to the output of said pre-circuit filter at the other end;
- a series circuit connected in parallel with said frequency-determining capacitor, said series circuit comprising first, second, and third frequency-determining coils connected in series, the first coil being connected to ground at one end of the series circuit, and the third coil being coupled to the input of pre-amplifier via the coupling capacitor at the other end of the series circuit, said single range switch being connected in parallel with the second and third coils; and
- a matching coil, one side of which being connected to the connection point between said second and third coils and the other side being connected to said antenna connection, wherein when said single range switch is closed, only said first coil is frequency-determining for the high frequency range.

6. A television tuner according to claim 5, further comprising a UHF tuner branch having a mixer stage, a first range switch and a second range switch, wherein said first range switch is positioned between said antenna connection and said pre-circuit filter, said second range switch is connected to said antenna connection at one end and to the UHF tuner branch at the other end, and wherein the outputs of said first and second band-pass filters are each connected to their respective mixer stage and the output of the mixer stage of the UHF tuner branch is connected together with the outputs of the other mixer stages to an intermediate frequency selector having a joint intermediate frequency output.

7. A television tuner according to claim 5, wherein said matching coil is dimensioned for the high frequency range.

8. A television tuner for at least two frequency bands from VHF band I up to and including the hyperband, one of the bands being in a high frequency range and another being in a low frequency range, said television tuner comprising:
- a joint pre-amplifier,
- a two-stage switching device connected to the output of said pre-amplifier and having two outputs; and
- an band-pass filter circuit comprising a first band-pass filter connected to one of the two switching outputs and a second band-pass filter connected to the other switching output, said band-pass filter circuit being switchable and tunable between said at least two frequency bands wherein the two-stage switching device comprises a first switching coil connected to the output of the pre-amplifier at one end and a band switch, one end of which is connected to the other end of the first switching coil; the first band-pass filter is for the high frequency range and is connected via a first capacitor to the output of said pre-amplifier; and the second band-pass filter is for the low frequency range and when the band switch is open, is connected via a series circuit comprising the first switching coil and a second capacitor to the output of the pre-emplifier, said band switch being connected between the connection point of said first switching coil and said second capacitor and ground.

9. A television tuner according to claim 8, wherein when said band switch is closed, said first capacitor and said first switching coil form a high-pass filter for the high frequency range and said second band-pass filter for the low frequency range is short-circuited on the input side.

10. A television tuner according to claim 8, wherein when said band switch is open, said first switching coil with the capacitor formed from said first capacitor and the input impedance of said first band-pass filter forms a low-pass filter for the low frequency range and said first band-pass filter is detuned for the high frequency range.

11. A television tuner according to claim 8, wherein the two-stage switching device comprises a second switching coil connected in series with said first switching coil, the second switching coil being parallel to said band switch and a high-frequency choke that is connected on one side to a DC source, and wherein when said band switch is open, said output of said pre-amplifier is connected with the DC source for supplying DC current to the active amplifier element of the pre-amplifier.

12. A television tuner according to claim 8, wherein the two-stage switching device further comprises a second switching coil connected in series with the first switching coil, a diode, a blocking capacitor and a switch having two switching sontacts, and the second switching coil is a high frequency choke; said connection point between said first switching coil and said second capacitor is connectable on the one side via said band switch and said blocking capacitor to ground for the high frequency range and via one of the switching contacts to a voltage source for DC current; and on the other side via a series circuit comprising the high-frequency choke, the diode and the other contact of the switching contacts to said voltage source.

13. A television tuner having a joint antenna connection for receiving two frequency ranges sweeping the frequencies from VHF band I up to and including the hyperband, comprising:
- a pre-circuit filter, connected to the joint antenna connection, including a resonant circuit having switchable coils for the two frequency ranges, one of which is a high frequency range and the other is a low frequency range;
- a pre-amplifier circuit dimensioned for the two frequency ranges and connected to the output of said pre-circuit filter;
- a two-stage switching device connected to the output of the pre-amplifier circuit and having two outputs;
- a first band-pass filter connected to one of the two switching outputs at one end and to a subsequent first mixer stage at the other end;
- a second band-pass filter connected to the other switching output at one end and to a subsequent second mixer stage at the other end; and
- an intermediate frequency circuit coupled to the outputs of the subsequent mixer stages wherein the two-stage switching device switches simultaneously with said pre-circuit filter.

14. A television tuner according to claim 13, wherein said resonant circuit includes first, second and third frequency-determining coils connected in series, the first coil being connected to ground at one end of the series and the third coil being coupled to the output of the pre-circuit filter at the other end of the series; and said pre-circuit filter further comprises a joint frequency determining capacitor connected in parallel with the resonant circuit; a single range switch connected in parallel with the second and third coils; and a matching coil connected between said antenna connection and the connection point between said second and third coils so that when said single range switch is closed, only said first coil is frequency determining for the high frequency range.

15. A television tuner according to claim 13, wherein said pre-circuit filter is tunable.

16. A television tuner according to claim 14, wherein said matching coil is dimensioned for the high frequency range.

17. A television tuner according to claim 14, wherein said pre-circuit filter further comprises a correction capacitor connected in parallel with said single range switch.

18. A television tuner according to claim 13, further comprising a first capacitor connected between the output of said pre-amplifier circuit and said first band-pass filter, and a second capacitor connected between the output of said pre-amplifier circuit and said second band-pass filter; and wherein the two-stage switching device comprises a first switching coil connected to the output of the pre-amplifier circuit at one end and a band switch, one end of which is connected to the other end said first switching coil and said second capacitor, and the other end of the band switch is coupled to ground; and the output of said pre-amplifier circuit is connected by the one of the two switching ouptus to said first band-pass filter for the high frequency range via a high-pass filter formed by the first capacitor and said first switching coil, and when the band switch is open, the output of the pre-amplifier circuit is connected by the other switching output to said second band-pass filter for the low-frequency range via a low-pass circuit comprising said first switching coil and a capacitor formed by the input impedance of said band switch and said second capacitor.

19. A television tuner according to claim 18, wherein said first capacitor with said first switching coil forms, when said band switch is closed, a high-pass filter for the high frequency range, and said second band-pass filter for the low frequency range is short-circuited on the input side.

20. A television tuner according to claim 18, wherein when said band switch is open, said first switching coil with the capacitor formed by said first capacitor and said first switching coil forms a low-pass filter for the low frequency range and the first band-pass filter is detuned for the high frequency range.

21. A television tuner according to claim 18, wherein the two-stage switching device comprises two coils connected in series, one of which is the first switching coil, the other end of which is connected to the second switching coils, said second coil is parallel to the band switch and is a high-frequency choke connected on its other side to a DC source, and when the band switch is open, the output of said pre-amplifier circuit is connected to the DC source for supplying direct current to the active amplifier element of the pre-amplifier circuit.

22. A television tuner according to claim 18, wherein the two-stage switching device further comprises a second switching coil connected in series with said first switching coil, a diode, a blocking capacitor and a switch having two switching contacts, and the second switching coil is a high frequency choke; said connection point between said first switching coil and said second capacitor is connectable on the one side via said band switch and said blocking capacitor to ground for the high frequency range and via one of the switching contacts to a voltage source for DC current; and on the other side via a series circuit comprising the high-frequency choke, the diode and the other contact of the switching contacts to said voltage source.

23. A television tuner according to claim 13, further comprising a UHF tuner branch having a mixer stage, a first range switch and a second range switch, wherein between said antenna connection and said pre-circuit filter the first range switch is connected, the second range switch is connected to said antenna connection at one end and to the UHF tuner branch at the other end, and wherein the output of the mixer stage of the UHF tuner branch is connected together with the outputs of the respective mixer stages of said first and second band-pass filters to an intermediate frequency selector having a joint intermediate frequency output.

24. An input circuit of a television tuner for frequency bands from VHF band I up to and including the hyperband, comprising:
    an antenna connection; and
    filter means for dividing the entire band from VHF band I up to and including the hyperband into two reception frequency ranges, one of which is a low-frequency range and the other is a high frequency range, said filter means comprising:
        a frequency-determining capacitor, said capacitor being grounded at one end and being connected to an output at the other end; a series circuit connected in parallel with said capacitor, said series circuit comprising first, second and third frequency-determining coils connected in series, the first coil being connected to ground at one end of the series circuit, and the third coil being connected to the output at the other end of the series circuit; a single range switch for switching between the low frequency range and the high frequency range of the frequency bands, said single range switch being connected in parallel with the second
        and third coils; and a coil array connected to said antenna connection, wherein said coil array is a matching coil connected between said antenna connection and the connection point of said second and third coils of the series circuit so that when said single range switch is closed, only said first coil is frequency-determining for the high frequency range.

25. An input circuit according to claim 24, wherein said capacitor of said filter means is adjustable.

26. An input circuit according to claim 24, wherein when said single range switch is closed, the second and third coils form a parallel circuit and the matching coil connected in series with the parallel circuit forms a circuit which serves to match said filter means with the wave impedance of the antenna connection for the high frequency range, the inductance of said matching coil being changeable to tune the match.

27. An input circuit according to claim 24, wherein said filter means further comprises a correction capacitor connected in parallel with said single range switch.

28. An input circuit according to claim 24, further comprising a pre-amplifier connected to the output of said filter means, a two-stage changeover device having two outputs, a first band-pass filter connected to one of the two changeover outputs, and a second band-pass filter connected to the other changeover output, wherein said output of said pre-amplifier is connected to the two-stage changeover device which is switched simultaneously with said single range switch of the filter means to send signals to one of the band-pass filters, and wherein the outputs of said band-pass filters are each connected to their respective mixer stages.

29. An input circuit according to claim 28, wherein the two-stage changeover device comprises two coils connected in series, one of which is connected to the output of the pre-amplifier, and a band switch wherein the first band-pass filter is for the high frequency range and is connected via a first capacitor to the output of the pre-amplifier; and the second band-pass filter is for the low frequency range and when the band switch is open, is connected via a series circuit comprising the one coil of the two changeover coils and a second capacitor to the output of the pre-amplifier, and wherein the band switch is connected between the connection point of said one coil and said second capacitor and ground.

30. An input circuit according to claim 29, wherein the changeover device further comprises a third capacitor connected to ground at one end, and when the band switch is closed, the first capacitor forms with the one coil of the two changeover coils which is connected to ground via the third capacitor at high frequency, a high-pass filter for the high frequency range and the second band-pass filter is short-circuited for the low frequency range on the input side.

31. An input circuit according to claim 29, wherein when the band switch is open, the one coil of the two changeover coils with the capacitor formed by the first capacitor and the input impedance of the first band-pass filter forms a band-pass filter for the low frequency range, and said first band-pass filter is detuned for the high frequency range.

32. An input circuit according to claim 29, wherein the other coil of the two changeover coils is parallel to the band switch and is a high frequency choke connected on one side to a DC source, and when the band switch is open, the output of the pre-amplifier is connected to the DC source for supplying direct current to the active amplifier element of the pre-amplifier.

33. An input circuit according to claim 29, wherein the two-stage changeover device further comprises a diode, a blocking capacitor, and a switch having two switching contacts and wherein the other coil is a high-frequency choke, and the connection point between the one coil and the second capacitor is connectable on one side via the band switch and the blocking capacitor to ground for high frequency and via one of the switching contacts to a voltage source for direct current, and on the other side for low frequency via the series circuit comprising the high frequency choke, the diode and the other contact of the switching contacts to the voltage source.

34. An input circuit according to claim 24, further comprising a UHF tuner banch, a fist range switch and a second range switch, wherein between the antenna connection and the filter means the first range switch is connected, the second range switch is connected to said antenna connection at one end and to the UHF tuner branch at the other end, and wherein the output of the mixer stage of the UHF tuner branch is connected together with the outputs of other mixer stages to an intermediate frequency selector having a common intermediate frequency output.

* * * * *